US010778193B1

(12) United States Patent
Huang

(10) Patent No.: US 10,778,193 B1
(45) Date of Patent: Sep. 15, 2020

(54) RESAMPLING APPARATUS AND METHOD THEREOF

(71) Applicant: MICROELECTRONICS TECHNOLOGY, INC., Hsinchu (TW)

(72) Inventor: Chih-Jung Huang, Hsinchu (TW)

(73) Assignee: MICROELECTRONICS TECHNOLOGY, INC., Hsinchu (TW)

( * ) Notice: Subject to any disclaimer, the term of this patent is extended or adjusted under 35 U.S.C. 154(b) by 0 days.

(21) Appl. No.: 16/698,036

(22) Filed: Nov. 27, 2019

(51) Int. Cl.
*H03M 7/00* (2006.01)
*H03H 17/06* (2006.01)
*H03H 17/02* (2006.01)
*H03M 1/66* (2006.01)

(52) U.S. Cl.
CPC .... *H03H 17/0685* (2013.01); *H03H 17/0275* (2013.01); *H03H 17/065* (2013.01); *H03M 1/66* (2013.01)

(58) Field of Classification Search
CPC ...... H03M 3/404; H03M 3/422; H03M 3/436; H03M 3/468; H03M 3/358; H03M 3/386; H03M 3/498; G06F 17/147; G06F 17/17; H04N 19/132; H04N 19/176; H04N 19/18; H04N 19/48; H04N 19/59; H04N 19/60; H04N 19/90; H04N 2209/046; H04N 5/14; H04N 5/2628; H04N 9/045
USPC .............................................. 341/61; 708/313
See application file for complete search history.

(56) References Cited

U.S. PATENT DOCUMENTS

| 6,208,671 | B1* | 3/2001 | Paulos | H03H 17/0628 341/61 |
| 6,226,661 | B1* | 5/2001 | Savell | G10L 21/04 341/61 |
| 7,342,526 | B2* | 3/2008 | Lee | H03M 1/74 341/144 |
| 2003/0025620 | A1* | 2/2003 | Bland | G10L 19/0204 341/61 |
| 2008/0068234 | A1* | 3/2008 | Forman | H03H 17/0628 341/61 |

(Continued)

OTHER PUBLICATIONS

Jennifer L. H. Webb, "Transposed FIR Filter Structure with Time-Varying Coefficients for Digital Data Resampling," IEEE Trans. Signal Processing, Sep. 2000, pp. 2594-2600, vol. 48, No. 9.

*Primary Examiner* — Linh V Nguyen
(74) *Attorney, Agent, or Firm* — Muncy, Geissler, Olds & Lowe, P.C.

(57) ABSTRACT

The present disclosure provides a resampling apparatus and a resampling method. The resampling apparatus includes a control unit, a memory device, a resolution identifier, a phase rate generator, a coefficient generator, and a resample filter. The control unit controls reading and writing operations of the resampling apparatus according to a control signal. The memory device transmits the control signal to the control unit. The resolution identifier sets a resolution bandwidth identity according to an interpolation/decimation (I/D) value of the control signal. The phase rate generator generates a phase select signal and a counter enable signal according to the resolution bandwidth identity. The coefficient generator generates a coefficient select signal according to the resolution bandwidth identity. The resample filter generates a resampled output data according to the phase select signal, the coefficient select signal, and an input data.

20 Claims, 6 Drawing Sheets

(56) References Cited

U.S. PATENT DOCUMENTS

2009/0319065 A1* 12/2009 Risbo ............... G11B 20/10527
700/94
2019/0340143 A1* 11/2019 Shaeffer ............... G11C 7/1066

* cited by examiner

RESAMPLING APPARATUS AND METHOD THEREOF

TECHNICAL FIELD

The present disclosure relates to a resampling apparatus and a resampling method with configurable settings.

DISCUSSION OF THE BACKGROUND

As communication technology advances, new types of communication systems based on a variety of standards are being created. Various communication technologies utilize different sampling frequencies according to the modulation scheme and the usable frequency band, making effective conversion between different sampling frequencies essential. An analog-to-digital converter maintains the same sampling rate for sampling frequency conversion, which is not optimal in many situations, such as for a spectrum analyzer application. On the other hand, traditional resample filters have a rigid converter structure, leading to excessive processing costs. Therefore, a resampling apparatus with economical processing costs and a configurable resample filter structure is highly desirable.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a resampling apparatus, including a control unit, a memory device, a resolution identifier, a phase rate generator, a coefficient generator, and a resample filter. The control unit controls reading and writing operations of the resampling apparatus according to a control signal. The memory device transmits the control signal to the control unit. The resolution identifier sets a resolution bandwidth identity according to an interpolation/decimation (I/D) value of the control signal. The phase rate generator generates a phase select signal and a counter enable signal according to the resolution bandwidth identity. The coefficient generator generates a coefficient select signal according to the resolution bandwidth identity. The resample filter generates a resampled output data according to the phase select signal, the coefficient select signal, and an input data.

In some embodiments, the resample filter comprises a plurality of pipeline stages, a counter control unit, a phase-setting unit, a coefficient-setting unit, a calculation unit, and a pipeline accumulator unit. The pipeline stages receive the input data and transmit the input data to a first converter, wherein the first converter converts a data format of the input data to an internal data format. The counter control unit outputs the counter enable signal according to the resolution bandwidth identity. The phase-setting unit outputs a phase information signal according to the phase select signal and the counter enable signal. The coefficient-setting unit outputs a set of coefficients according to the coefficient select signal and the phase information signal. The calculation unit comprises a set of operators, and the calculation unit generates a resampled result for each output of the first converter according to the set of coefficients. The pipeline accumulator unit adds all of the resampled results of the calculation unit in the pipeline stages and outputs the resampled output data.

In some embodiments, the resample filter further comprises a set of second converters, wherein the set of second converters function to convert the data format of the resampled results of the calculation unit to the internal data format before the resampled results of the calculation unit are transmitted to the pipeline accumulator unit.

In some embodiments, the resample filter further comprises a third converter for converting the data format of the resampled output data to an output data format.

In some embodiments, the resample filter further comprises a synchronization detection unit for monitoring a data synchronization. status of the resample filter, wherein the synchronization detection unit terminates the output of the resampled output data when a synchronization loss is detected.

In some embodiments, the resampling apparatus further comprises a bypass unit for bypassing the operations of the resampling apparatus when the VD value of the control signal is one, wherein the bypass unit transmits the input data to a data selector.

In some embodiments, the memory device is an internal memory device or an external memory device.

Another aspect of the present disclosure provides a resampling apparatus, including a control unit, a communication interface, a resolution identifier, a phase rate generator, a coefficient generator, and a resample filter. The control unit controls reading and writing operations of the resampling apparatus according to a control signal. The communication interface transmits the control signal to the control unit. The resolution identifier sets a resolution bandwidth identity according to an I/D value of the control signal. The phase rate generator generates a phase select signal and a counter enable signal according to the resolution bandwidth identity. The coefficient generator generates a coefficient select signal according to the resolution bandwidth identity. The resample filter generates a resampled output data according to the phase select signal, the coefficient select signal, and an input data.

In some embodiments, the resample filter comprises a plurality of pipeline stages, a counter control unit, a phase-setting unit, a coefficient-setting unit, a calculation unit, and a pipeline accumulator unit. The pipeline stages receive the input data and transmit the input data to a first converter, wherein the first converter converts a data format of the input data to an internal data format. The counter control unit outputs the counter enable signal according to the resolution bandwidth identity. The phase-setting unit outputs a phase information signal according to the phase select signal and the counter enable signal. The coefficient-setting unit outputs a set of coefficients according to the coefficient select signal and the phase information signal. The calculation unit comprises a set of operators, and the calculation unit generates a resampled result for each output of the first converter according to the set of coefficients. The pipeline accumulator unit adds all of the resampled results of the calculation unit in the pipeline stages and outputs the resampled output data.

In some embodiments, the resample filter further comprises a set of second converters, wherein the set of second converters functions to convert the data format of the resampled results of the calculation unit to the internal data format before the resampled results of the calculation unit are transmitted to the pipeline accumulator unit.

In some embodiments, the resample filter further comprises a third converter for converting the data format of the resampled output data to an output data format.

In some embodiments, the resample filter further comprises a synchronization detection unit for monitoring a data synchronization status of the resample filter, wherein the synchronization detection unit terminates the output of the resampled output data when a synchronization loss is detected.

In some embodiments, the resampling apparatus further comprises a bypass unit for bypassing the operations of the resampling apparatus when the I/D value of the control signal is one, wherein the bypass unit transmits the input data to a data selector.

In some embodiments, the I/D value of the control signal is configurable through the communication interface.

Another aspect of the present disclosure provides a resampling method, including transmitting a control signal to a control unit; controlling, by the control unit, reading and writing operations according to the control signal; setting, by a resolution identifier, a resolution bandwidth identity according to an interpolation/decimation (I/D) value of the control signal; generating, by a phase rate generator, a phase select signal and a counter enable signal according to the resolution bandwidth identity; generating, by a coefficient generator, a coefficient select signal according to the resolution bandwidth identity; and generating, by a resample filter, a resampled output data according to the phase select signal, the coefficient select signal, and an input data.

In some embodiments, the step of generating, by the resample filter, the resampled output data according to the phase select signal, the coefficient select signal, and the input data comprises: receiving, in a plurality of pipeline stages, the input data and transmitting the input data to a first converter, wherein the first converter converts a data format of the input data to an internal data format; outputting, by a counter control unit, the counter enable signal according to the resolution bandwidth identity; outputting, by a phase-setting unit, a phase information signal according to the phase select signal and the counter enable signal; outputting, by a coefficient-setting unit, a set of coefficients according to the coefficient select signal and the phase information signal; generating, by a calculation unit comprising a set of operators, a resampled result for each output of the first converter according to the set of coefficients; and adding, by a pipeline accumulator unit, all of the resampled results of the calculation unit in the pipeline stages and outputting the resampled output data.

In some embodiments, the step further comprises converting, by a set of second converters, the data format of the resampled results of the calculation unit to the internal data format before the resampled results of the calculation unit are transmitted to the pipeline accumulator unit.

In some embodiments, the step further comprises converting, by a third converter, the data format of the resampled output data to an output data format.

In some embodiments, the step further comprises monitoring, by a synchronization detection unit, a data synchronization status and terminating the output of the resampled output data when a synchronization loss is detected.

In some embodiments, the resampling method further comprises bypassing, by a bypass unit, resampling operations when the I/D value of the control signal is one and transmitting the input data to a data selector.

Due to the pipeline structures of the pipeline stages and the pipeline accumulator units, as well as the fast configuration settings, the computational speeds of the resampling apparatuses in the present disclosure are enhanced. Moreover, only 1×M signal operators are required, compared to the M×N signal operator required in the fixed structure of many traditional resample filters. Through the communication interface, the user can configure any I/D values for resolution bandwidth combinations not already stored in internal or external memory. Moreover, the resampling apparatuses allow for sample rate transfer, as well as support for synchronization detection in case of data loss.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
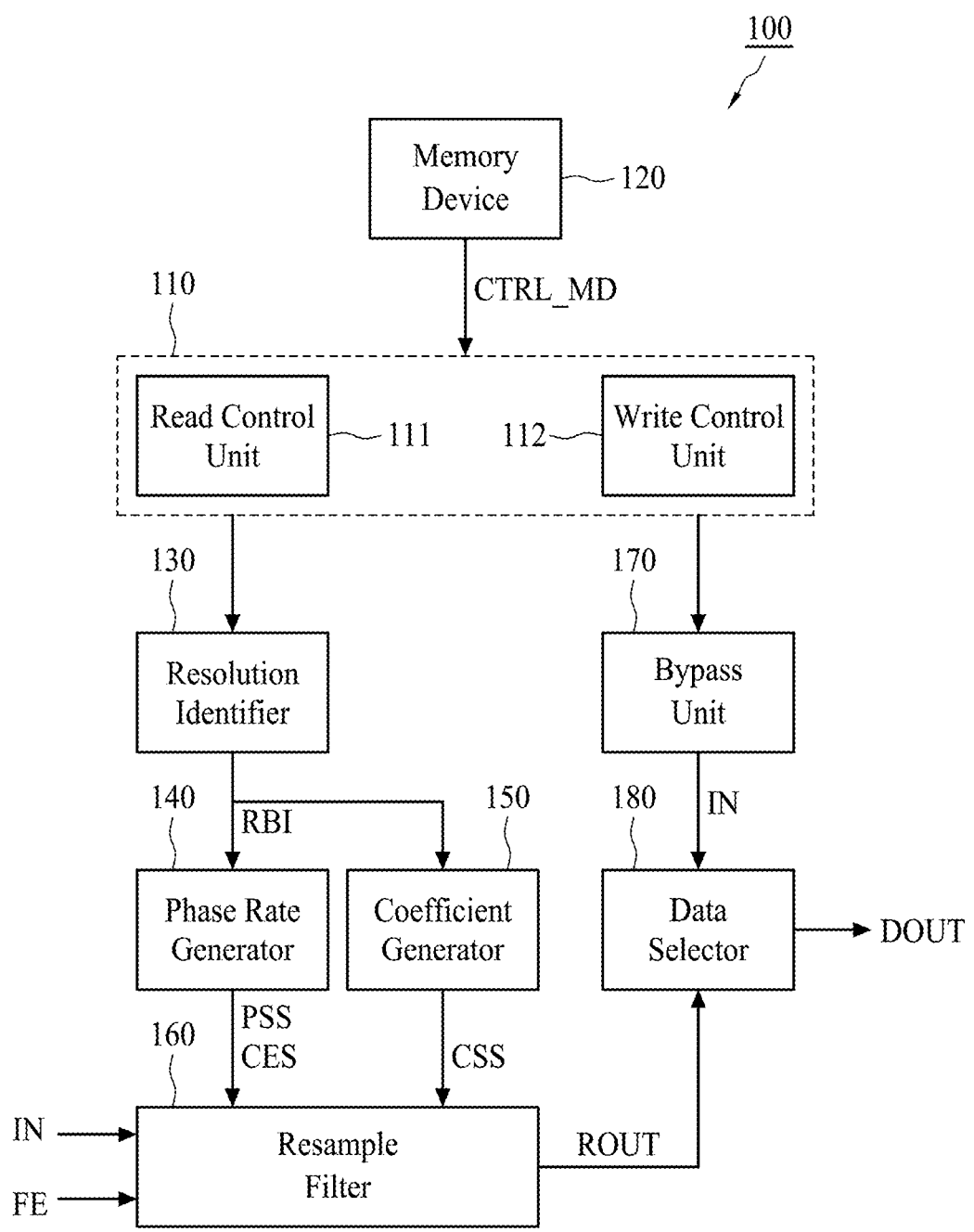
FIG. 1 is a block diagram of a resampling apparatus according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a block diagram of a resampling apparatus 100 according to some embodiments of the present disclosure. With reference to FIG. 1, the resampling apparatus 100 includes a control unit 110, a memory device 120, a resolution identifier 130, a phase rate generator 140, a coefficient generator 150, and a resample filter 160. In some embodiments, the memory device 120 may transmit a control signal CTRL_MD to the control unit 110. The memory device 120 may be an internal memory device such as a read-only memory (ROM) or a random access memory (RAM), or an external memory device such as a removable memory card. The control unit 110 may include a read control unit 111 and a write control unit 112 for controlling reading and writing operations of the resampling apparatus 100 according to the control signal CTRL_MD. The control unit 110 may also include a sample buffer (not shown) for temporarily storing signals used for the reading and writing operations of the resampling apparatus 100. The resolution identifier 130 may set a resolution bandwidth identity RBI according to an interpolation/decimation (I/D) value of the control signal CTRL_MD. The I/D value of the control signal CTRL_MD may be used to identify a resolution bandwidth for a resampling rate, wherein the resolution bandwidth can be used in a spectrum analyzer application, or in video and audio data resampling applications. In some embodiments, the phase rate generator 140 may generate a phase select signal PSS and a counter enable signal CES according to the resolution bandwidth identity RBI. The coefficient generator 150 may generate a coefficient select signal CSS according to the resolution bandwidth identity RBI. In some embodiments, the resample filter 160 may generate a resampled output data ROUT according to the phase select signal PSS, the coefficient select signal CSS, and an input data IN. In some embodiments, the input data IN may include in-phase and quadrature (IQ) data, although the present disclosure is not limited thereto. In some embodiments, a filter enable signal FE may be transmitted to the resample filter 160 in order to enable the resample filter 160. The resampling apparatus 100 may further include a bypass unit 170 and a data selector 180. In some embodiments, when the I/D value of the control signal CTRL_MD is one, the bypass unit 170 may bypass the operations of the resampling apparatus 100 and transmit the input data IN to the data selector 180. If required, the bypass unit 170 may also adjust a data format of the input data IN to conform to an output data format before transmitting the input data IN to the data selector 180. In some embodiments, the data selector 180 selects an output data DOUT according to the control signal CTRL_MD.

Figure 2:
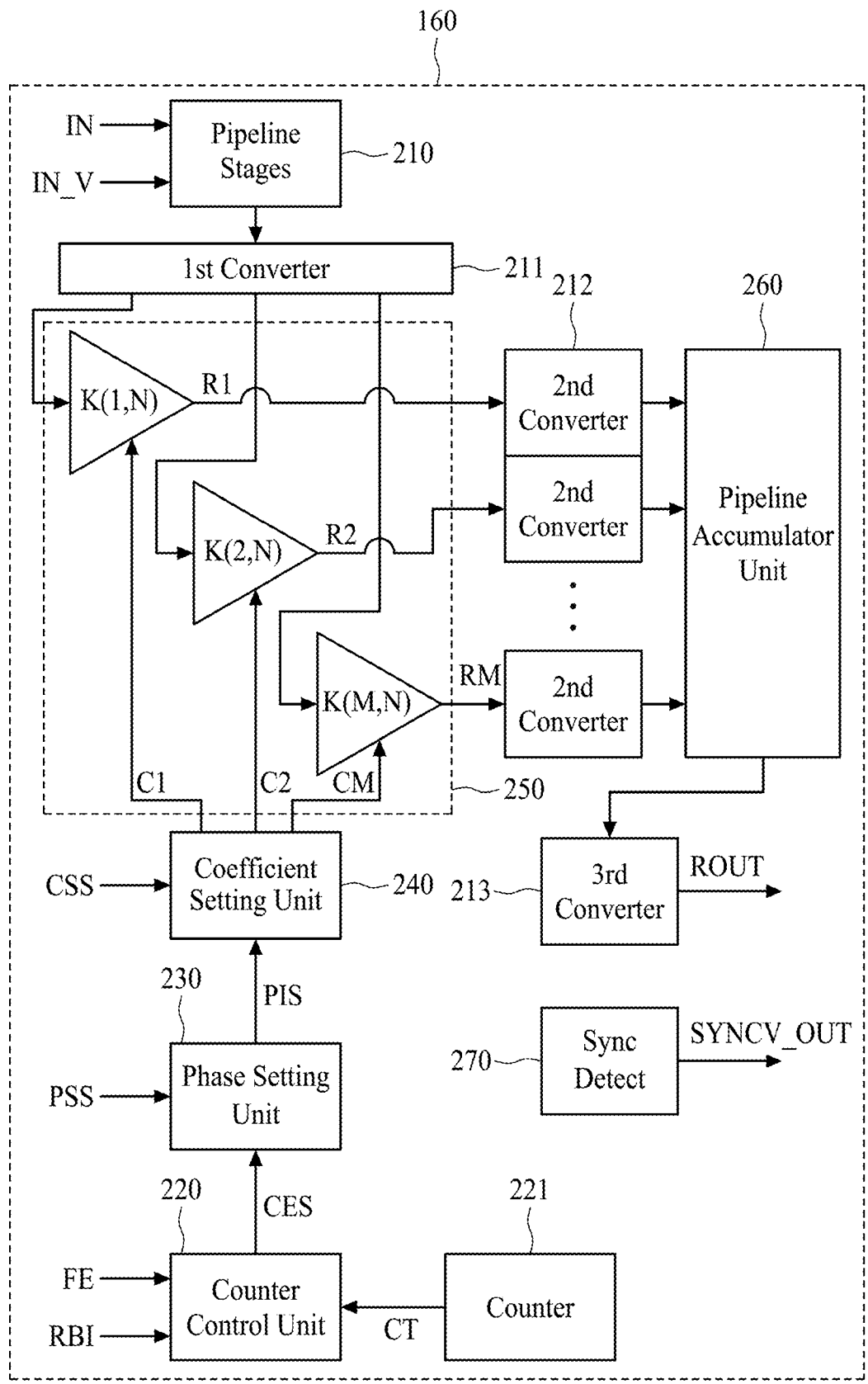
FIG. 2 is a block diagram of a resample filter according to some embodiments of the present disclosure.

FIG. 2 is a block diagram of the resample filter 160 according to some embodiments of the present disclosure. With reference to FIG. 2, the resample filter 160 includes a plurality of pipeline stages 210, a counter control unit 220, a phase-setting unit 230, a coefficient-setting unit 240, a calculation unit 250, and a pipeline accumulator unit 260. In some embodiments, the pipeline stages 210 receive the input data IN and transmit the input data IN to a first converter 211. In some embodiments, the pipeline stages 210 may also receive a data valid signal my, which confirms the validity of the input data IN. The first converter 211 may convert the data format of the input data IN to an internal data format. The counter control unit 220 outputs the counter enable signal CES according to the resolution bandwidth identity RBI and a counter value CT from a counter 221. Moreover, the filter enable signal FE is transmitted to the counter control unit 220 to enable the resample filter 160. The phase-setting unit 230 outputs a phase information signal PIS according to the phase select signal PSS and the counter enable signal CES. The coefficient-setting unit 240 outputs a set of coefficients C1 to CM according to the coefficient select signal CSS and the phase information signal PIS. The coefficient-setting unit 240 may obtain the set of coefficients C1 to CM from a coefficient lookup table, for example, although the present disclosure is not limited thereto. The calculation unit 250 includes a set of operators K(1,N) to K(M,N), and the calculation unit 250 generates resampled results R1 to RM for each output of the first converter 211 according to the set of coefficients C1 to CM, where M is the Mth number of the coefficients C1 to CM and N is a phase rate according to the phase information signal PIS. In some embodiments, the set of operators K(1,N) to K(M,N) may include multipliers or other signal processing operators suitable for the resampling apparatus 100. The pipeline accumulator unit 260 adds all of the resampled results R1 to RM of the calculation unit 250 in the pipeline stages 210 and outputs the resampled output data ROUT.

In some embodiments, the resample filter 160 further includes a set of second converters 212. The set of second converters 212 may convert the data format of the resampled results R1 to RM of the calculation unit 250 to the internal data format before the resampled results R1 to RM are transmitted to the pipeline accumulator unit 260. In some embodiments, the resample filter 160 further includes a third converter 213 for converting the data format of the resampled output data ROUT to an output data format. In some embodiments, the resample filter 160 further includes a synchronization detection unit 270 for monitoring a data synchronization status of the resample filter 160. The synchronization detection unit 270 terminates the output of the resampled output data ROUT when a synchronization loss is detected. When no synchronization loss is detected, the synchronization detection unit 270 outputs a synchronization valid signal SYNCV_OUT. Due to the pipeline structures of the pipeline stages 210 and the pipeline accumulator unit 260 of the resampling apparatus 100 shown in FIG. 1 and FIG. 2, computational speed of the resampling apparatus 100 can be increased to between about 100 and 4625 clock cycles for 76-resolution bandwidth combinations stored in the memory device 120. Moreover, in the resampling apparatus 100, only 1×M signal operators are required, compared to the M×N signal operators required in the fixed structure of many traditional resample filters.

Figure 3:
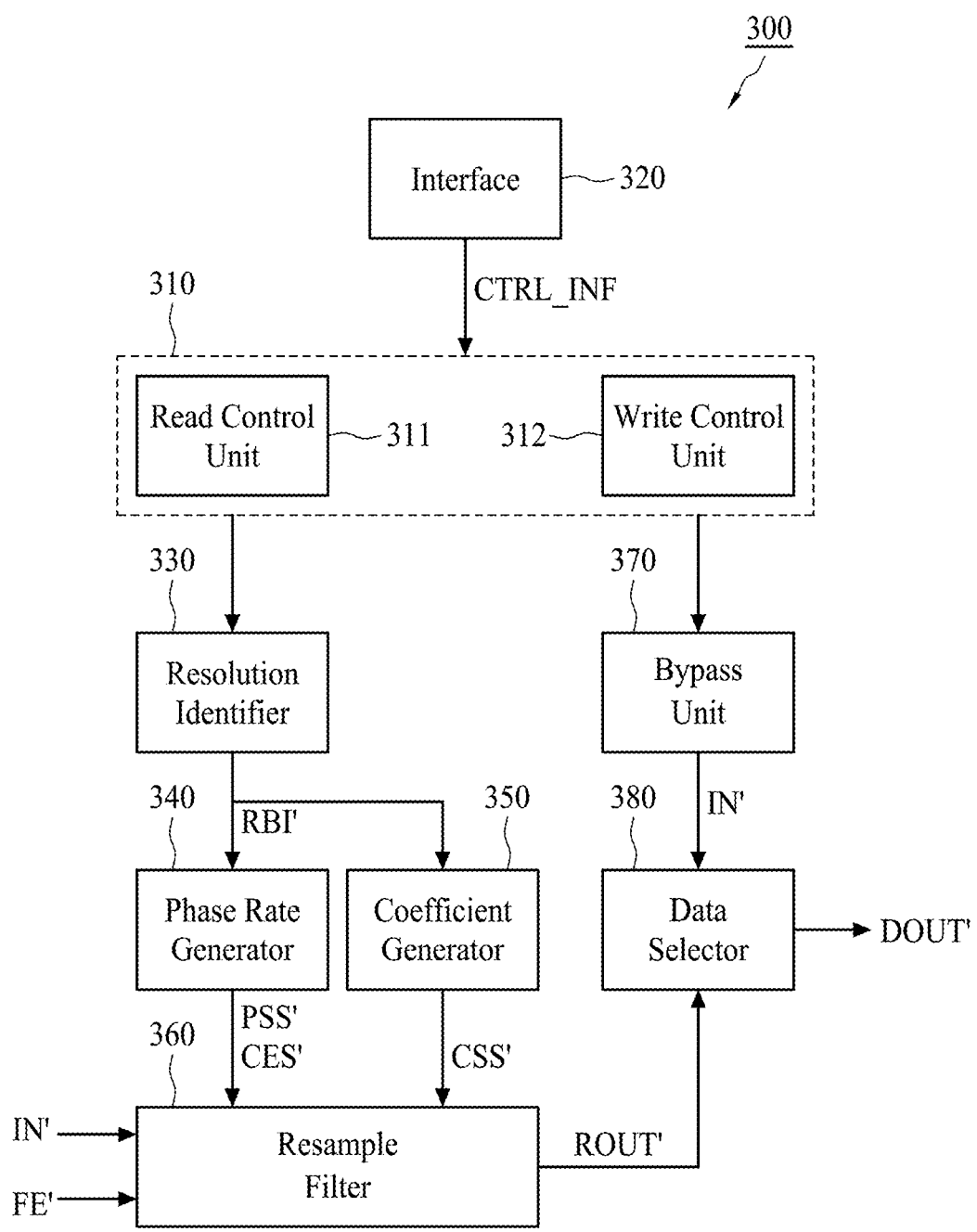
FIG. 3 is a block diagram of a resampling apparatus according to some embodiments of the present disclosure.

It should be noted that, although the resampling apparatus 100 utilizes the I/D values stored in the memory device 120 to output the resampled output data ROUT, or the resampled rate data, the resampling apparatuses in other embodiments of the present disclosure may be configured such that the I/D values may be obtained through a communication interface, for example. FIG. 3 is a block diagram of a resampling apparatus 300 according to some embodiments of the present disclosure. With reference to FIG. 3, the resampling apparatus 300 includes a control unit 310, a communication interface 320, a resolution identifier 330, a phase rate generator 340, a coefficient generator 350, and a resample filter 360. In some embodiments, the communication interface 320 may transmit a control signal CTRL_INF to the control unit 310. The communication interface 320 may be any suitable parallel communication interface, such as the Advanced eXtensible Interface (AXI), for example. The control unit 310 may include a read control unit 311 and a write control unit 312 for controlling reading and writing operations of the resampling apparatus 300 according to the control signal CTRL_INF. The control unit 310 may also include a sample buffer (not shown) for temporarily storing signals used for the reading and writing operations of the resampling apparatus 300. The resolution identifier 330 may set a resolution bandwidth identity RBI' according to an interpolation/decimation (I/D) value of the control signal CTRL_INF. The I/D value of the control signal CTRL_INF may be used to identify a resolution bandwidth for a resampling rate, wherein the resolution bandwidth can be used in a spectrum analyzer application, or in video and audio data resampling applications. Moreover, in some embodiments, the I/D value of the control signal CTRL_INF is configurable through the communication interface 320. In some embodiments, the phase rate generator 340 may generate a phase select signal PSS' and a counter enable signal CES' according to the resolution bandwidth identity RBI'. The coefficient generator 350 may generate a coefficient select signal CSS' according to the resolution bandwidth identity RBI'. In some embodiments, the resample filter 360 may generate a resampled output data ROUT' according to the phase select signal PSS', the coefficient select signal CSS', and an input data IN'. In some embodiments, the input data IN' may include in-phase and quadrature (IQ) data, although the present disclosure is not limited thereto. In some embodiments, a filter enable signal FE' may be transmitted to the resample filter 360 in order to enable the resample filter 360. The resampling apparatus 300 may further include a bypass unit 370 and a data selector 380. In some embodiments, when the I/D value of the control signal CTRL_INF is one, the bypass unit 370 may bypass the operations of the resampling apparatus 300 and transmit the input data IN' to the data selector 380. If required, the bypass unit 370 may also adjust a data foRmat of the input data IN' to conform to an output data format before transmitting the input data IN' to the data selector 380. In some embodiments, the data selector 380 selects an output data DOUT' according to the control signal CTRL_INF. Accordingly, the communication interface 320 of the resampling apparatus 300 enables a user to configure any I/D values for resolution bandwidth combinations not already stored in internal or external memory. Moreover, the pipeline structures of the pipeline stages and the pipeline accumulator unit of the resampling apparatus 300 allows for enhanced computational speed, similar to that in the resampling apparatus 100. As in the resampling apparatus 100, only 1×M signal operators are required for the resampling apparatus 300, unlike the M×N signal operators required in the fixed structure of many traditional resample filters.

Figure 4:
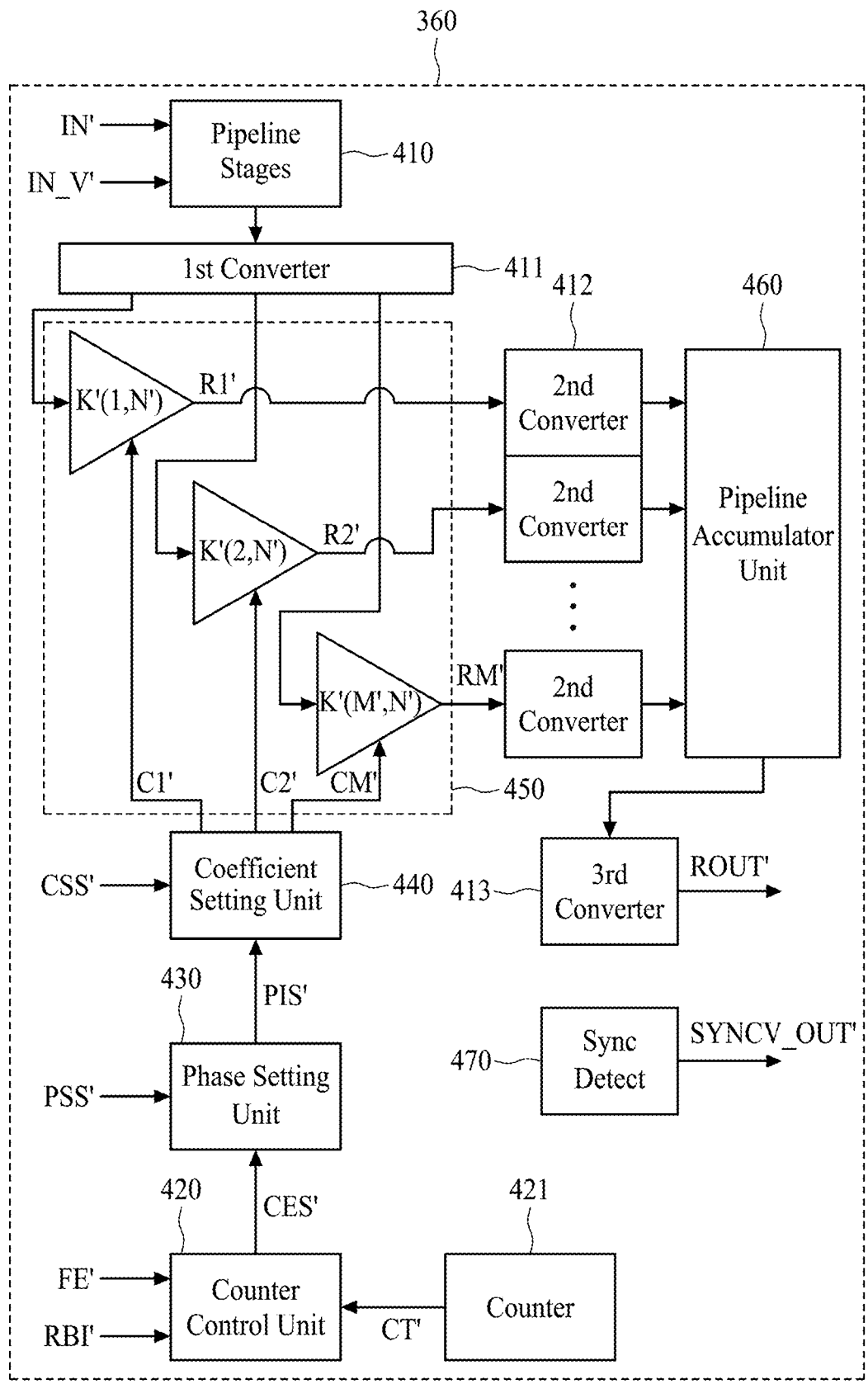
FIG. 4 is a block diagram of a resample filter according to some embodiments of the present disclosure.

FIG. 4 is a block diagram of the resample filter 360 according to some embodiments of the present disclosure. With reference to FIG. 4, the resample filter 360 includes a plurality of pipeline stages 410, a counter control unit 240, a phase-setting unit 430, a coefficient-setting unit 440, a calculation unit 450, and a pipeline accumulator unit 460. In some embodiments, the pipeline stages 410 receive the input data IN' and transmit the input data IN' to a first converter 411. In some embodiments, the pipeline stages 410 may also receive a data valid signal IN_V', which confirms the validity of the input data IN'. The first converter 411 may convert the data format of the input data IN' to an internal data format. The counter control unit 420 outputs the counter enable signal CES' according to the resolution bandwidth identity RBI' and a counter value CT' from a counter 421. Moreover, the filter enable signal FE' is transmitted to the counter control unit 420 to enable the resample filter 360. The phase-setting unit 430 outputs a phase information signal PIS' according to the phase select signal PSS' and the counter enable signal CES'. The coefficient-setting unit 440 outputs a set of coefficients C1' to CM' according to the coefficient select signal CSS' and the phase information signal PIS'. The coefficient-setting unit 440 may obtain the set of coefficients C1' to CM' from a coefficient lookup table, for example, although the present disclosure is not limited thereto. The calculation unit 450 includes a set of operators K'(1,N) to K'(M,N), and the calculation unit 450 generates resampled results R1' to RM' for each output of the first converter 411 according to the set of coefficients C1' to CM', where M' is the M'th number of the coefficients CF to CM' and N' is a phase rate according to the phase information signal PIS'. In some embodiments, the set of operators K'(1,N) to K'(M',N') may include multipliers or other signal processing operators suitable for the resampling apparatus 300. The pipeline accumulator unit 460 adds all of the resampled results R1' to RM' of the calculation unit 450 in the pipeline stages 410 and outputs the resampled output data ROUT'.

In some embodiments, the resample filter 360 further includes a set of second converters 412. The set of second converters 412 may convert the data format of the resampled results R1' to RM' of the calculation unit 450 to the internal data format before the resampled results R1' to RM' are transmitted to the pipeline accumulator unit 460. In some embodiments, the resample filter 360 further includes a third converter 413 for converting the data format of the resampled output data ROUT' to an output data format. In some embodiments, the resample filter 360 further includes a synchronization detection unit 470 for monitoring a data synchronization status of the resample filter 360. The synchronization detection unit 470 terminates the output of the resampled output data ROUT when a synchronization loss is detected. When no synchronization loss is detected, the synchronization detection unit 470 outputs a synchronization valid signal SYNCV_OUT'.

Figure 5:
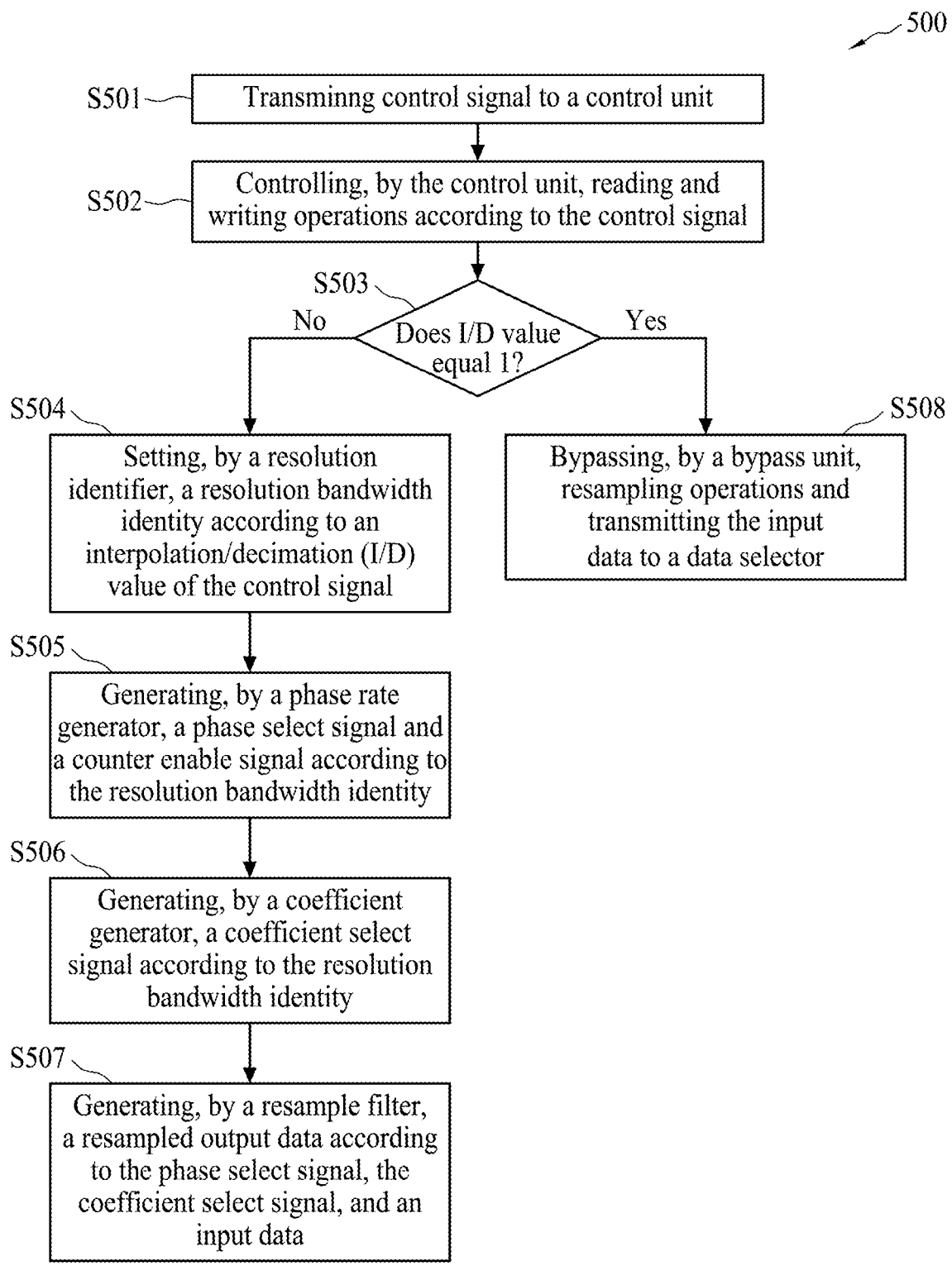
FIG. 5 is a flow diagram of a resampling method according to some embodiments of the present disclosure.

With reference to the resampling apparatus 100 shown in FIG. 1 and FIG. 2, a resampling method can be described in accordance with some embodiments of the present disclosure. FIG. 5 is a flow diagram of a resampling method 500 according to some embodiments of the present disclosure. With reference to FIG. 1 and FIG. 5, the resampling method 500 includes transmitting the control signal CTRL_MD to the control unit 110 (Step S501). Reading and writing operations of the resampling apparatus 100 are controlled by the control unit 110 according to the control signal CTRL_MD (Step S502). The I/D value of the control signal CTRL_MD is determined (Step S503), and when the I/D value is not equal to one, the resampling method 500 proceeds to set, by the resolution identifier 130, the resolution bandwidth identity RBI according to the I/D value of the control signal CTRL_MD (Step S504). The phase select signal PSS and the counter enable signal CES are generated by the phase rate generator 140 according to the resolution bandwidth identity RBI (Step S505). The coefficient select signal CSS is generated by the coefficient generator 150 according to the resolution bandwidth identity RBI (Step S506). The resampled output data ROUT is generated by the resample filter 160 according to the phase select signal PSS, the coefficient select signal CSS, and the input data IN (Step S507). In some embodiments, when the I/D value equals one, the resampling operations of the resampling method 500 are bypassed by the bypass unit 170, and the input data IN is transmitted to the data selector 180 (Step S508).

Figure 6:
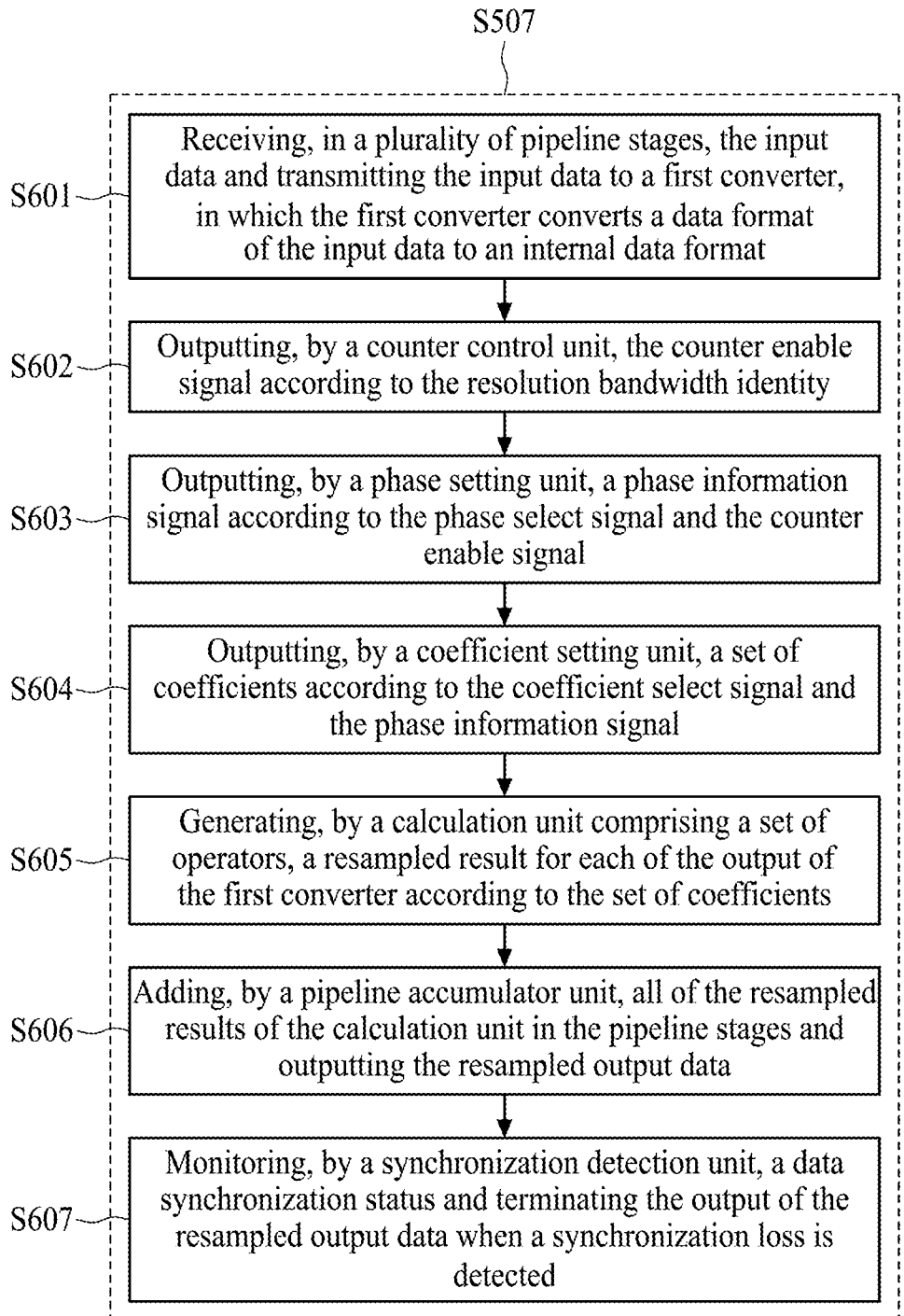
FIG. 6 is a flow diagram of a step in a resampling method according to some embodiments of the present disclosure.

FIG. 6 is a flow diagram of Step S507 in the resampling method 500 according to some embodiments of the present disclosure. With reference to FIG. 6, Step S507 in the resampling method 500 includes receiving, in the pipeline stages 210, the input data IN and transmitting the input data IN to a first converter 211, in which the first converter 211 converts a data format of the input data IN to an internal data format (Step S601). Next, the counter enable signal. CES is outputted by the counter control unit 220 according to the resolution bandwidth identity RBI (Step S602). The phase information signal PIS is outputted by the phase-setting unit 230 according to the phase select signal PSS and the counter enable signal CES (Step S603). Next, the set of coefficients C1 to CM is outputted by the coefficient-setting unit 240 according to the coefficient select signal CSS and the phase information signal PIS (Step S604). Next, the resampled results R1 to RM are generated by the calculation unit 250 including the set of operators K(1,N) to K(M,N), for each output of the first converter 211 according to the set of coefficients C1 to CM (Step S605). Next, all of the resampled results R1 to RM of the calculation unit 250 are added by the pipeline accumulator unit 260 in the pipeline stages 210 and the resampled output data ROUT is outputted (Step S606). In some embodiments, Step 507 further includes monitoring, by the synchronization detection unit 270, the data synchronization status and terminating the output of the resampled output data ROUT when the synchronization loss is detected (Step S607).

In some embodiments, Step 507 may further include converting, by the set of second converters 212, the data format of the resampled results R1 to RM of the calculation unit 250 to the internal data format before the resampled results R1 to RM are transmitted to the pipeline accumulator unit 260. In some embodiments, Step 507 may further include converting, by the third converter 213, the data format of the resampled output data ROUT to the output data format. Moreover, it should be noted that the resampling method 500 described in the present disclosure may also be applied to the resampling apparatus 300 shown in FIG. 3 and FIG. 4.

Due to the pipeline structures of the pipeline stages and the pipeline accumulator units, as well as the fast configuration settings of the resampling apparatuses in the present disclosure, the computational speeds of the resampling apparatuses are enhanced. Moreover, only 1×M signal operators are required, compared to the M×N signal operators required in the fixed structure of many traditional resample filters. Through the communication interface, the user can configure any I/D values for resolution bandwidth combinations not already stored in internal or external memory. Moreover, the resampling apparatuses allow for sample rate transfer, as well as support for synchronization detection in case of data loss.

One aspect of the present disclosure provides a resampling apparatus, including a control unit, a memory device, a resolution identifier, a phase rate generator, a coefficient generator, and a resample filter. The control unit controls reading and writing operations of the resampling apparatus according to a control signal. The memory device transmits the control signal to the control unit. The resolution identifier sets a resolution bandwidth identity according to an interpolation/decimation (I/D) value of the control signal. The phase rate generator generates a phase select signal and a counter enable signal according to the resolution bandwidth identity. The coefficient generator generates a coefficient select signal according to the resolution bandwidth identity. The resample filter generates a resampled output data according to the phase select signal, the coefficient select signal, and an input data.

Another aspect of the present disclosure provides a resampling apparatus, including a control unit, a communication interface, a resolution identifier, a phase rate generator, a coefficient generator, and a resample filter. The control unit controls reading and writing operations of the resampling apparatus according to a control signal. The communication interface transmits the control signal to the control unit. The resolution identifier sets a resolution bandwidth identity according to an I/D value of the control signal. The phase rate generator generates a phase select signal and a counter enable signal according to the resolution bandwidth identity. The coefficient generator generates a coefficient select signal according to the resolution bandwidth identity. The resample filter generates a resampled output data according to the phase select signal, the coefficient select signal, and an input data.

Another aspect of the present disclosure provides a resampling method, including transmitting a control signal to a control unit; controlling, by the control unit, reading and writing operations according to the control signal; setting, by a resolution identifier, a resolution bandwidth identity according to an interpolation/decimation. (I/D) value of the control signal; generating, by a phase rate generator, a phase select signal and a counter enable signal according to the resolution bandwidth identity; generating, by a coefficient generator, a coefficient select signal according to the resolution bandwidth identity; and generating, by a resample filter, a resampled output data according to the phase select signal, the coefficient select signal, and an input data.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A resampling apparatus, comprising:
   a control unit for controlling reading and writing operations of the resampling apparatus according to a control signal;

a memory device for transmitting the control signal to the control unit;
a resolution identifier for setting a resolution bandwidth identity according to an interpolation/decimation (I/D) value of the control signal;
a phase rate generator for generating a phase select signal and a counter enable signal according to the resolution bandwidth identity;
a coefficient generator for generating a coefficient select signal according to the resolution bandwidth identity; and
a resample filter for generating a resampled output data according to the phase select signal, the coefficient select signal, and an input data.

2. The resampling apparatus of claim 1, wherein the resample filter comprises:
a plurality of pipeline stages receiving the input data and transmitting the input data to a first converter, wherein the first converter converts a data format of the input data to an internal data format;
a counter control unit outputting the counter enable signal according to the resolution bandwidth identity;
a phase-setting unit outputting a phase information signal according to the phase select signal and the counter enable signal;
a coefficient-setting unit outputting a set of coefficients according to the coefficient select signal and the phase information signal;
a calculation unit comprising a set of operators, the calculation unit generating a resampled result for each output of the first converter according to the set of coefficients; and
a pipeline accumulator unit adding all of the resampled results of the calculation unit in the pipeline stages and outputting the resampled output data.

3. The resampling apparatus of claim 2, wherein the resample filter further comprises a set of second converters, and the set of second converters function to convert the data format of the resampled results of the calculation unit to the internal data format before the resampled results of the calculation unit are transmitted to the pipeline accumulator unit.

4. The resampling apparatus of claim 2, wherein the resample filter further comprises a third converter for converting the data format of the resampled output data to an output data format.

5. The resampling apparatus of claim 2, wherein the resample filter further comprises a synchronization detection unit for monitoring a data synchronization status of the resample filter, and the synchronization detection unit terminates the output of the resampled output data when a synchronization loss is detected.

6. The resampling apparatus of claim 1, further comprising a bypass unit for bypassing the operations of the resampling apparatus when the I/D value of the control signal is one, wherein the bypass unit transmits the input data to a data selector.

7. The resampling apparatus of claim 1, wherein the memory device is an internal memory device or an external memory device.

8. A resampling apparatus, comprising:
a control unit for controlling reading and writing operations of the resampling apparatus according to a control signal;
a communication interface for transmitting the control signal to the control unit;
a resolution identifier for setting a resolution bandwidth identity according to an interpolation/decimation (I/D) value of the control signal;
a phase rate generator for generating a phase select signal and a counter enable signal according to the resolution bandwidth identity;
a coefficient generator for generating a coefficient select signal according to the resolution bandwidth identity; and
a resample filter for generating a resampled output data according to the phase select signal, the coefficient select signal, and an input data.

9. The resampling apparatus of claim 8, wherein the resample filter comprises:
a plurality of pipeline stages receiving the input data and transmitting the input data to a first converter, wherein the first converter converts a data format of the input data to an internal data format;
a counter control unit outputting the counter enable signal according to the resolution bandwidth identity;
a phase-setting unit outputting a phase information signal according to the phase select signal and the counter enable signal;
a coefficient-setting unit outputting a set of coefficients according to the coefficient select signal and the phase information signal;
a calculation unit comprising a set of operators, the calculation unit generating a resampled result for each output of the first converter according to the set of coefficients; and
a pipeline accumulator unit adding all of the resampled results of the calculation unit in the pipeline stages and outputting a resampled output data.

10. The resampling apparatus of claim 9, wherein the resample filter further comprises a set of second converters for converting the data format of the resampled results of the calculation unit to the internal data format before the resampled results of the calculation unit are transmitted to the pipeline accumulator unit.

11. The resampling apparatus of claim 9, wherein the resample filter further comprises a third converter for converting the data format of the resampled output data to an output data format.

12. The resampling apparatus of claim 9, wherein the resample filter further comprises a synchronization detection unit for monitoring a data synchronization status of the resample filter, the synchronization detection unit terminating the output of the resampled output data when a synchronization loss is detected.

13. The resampling apparatus of claim 8, further comprising a bypass unit for bypassing the operations of the resampling apparatus when the I/D value of the control signal is one, wherein the bypass unit transmits the input data to a data selector.

14. The resampling apparatus of claim 8, wherein the I/D value of the control signal is configurable through the communication interface.

15. A resampling method, comprising:
transmitting a control signal to a control unit;
controlling, by the control unit, reading and writing operations according to the control signal;
setting, by a resolution identifier, a resolution bandwidth identity according to an interpolation/decimation (I/D) value of the control signal;
generating, by a phase rate generator, a phase select signal and a counter enable signal according to the resolution bandwidth identity;

generating, by a coefficient generator, a coefficient select signal according to the resolution bandwidth identity; and generating, by a resample filter, a resampled output data according to the phase select signal, the coefficient select signal, and an input data.

16. The resampling method of claim 15, wherein the step of generating, by the resample filter, the resampled output data according to the phase select signal, coefficient select signal, and the input data comprises:

receiving, in a plurality of pipeline stages, the input data and transmitting the input data to a first converter, wherein the first converter converts a data format of the input data to an internal data format;

outputting, by a counter control unit, the counter enable signal according to the resolution bandwidth identity;

outputting, by a phase-setting unit, a phase information signal according to the phase select signal and the counter enable signal;

outputting, by a coefficient-setting unit, a set of coefficients according to the coefficient select signal and the phase information signal;

generating, by a calculation unit comprising a set of operators, a resampled result for each output of the first converter according to the set of coefficients; and adding, by a pipeline accumulator unit, all of the resampled results of the calculation unit in the pipeline stages and outputting the resampled output data.

17. The resampling method of claim 16, further comprising converting, by a set of second converters, the data format of the resampled results of the calculation unit to the internal data format before the resampled results of the calculation unit are transmitted to the pipeline accumulator unit.

18. The resampling method of claim 16, further comprising converting, by a third converter, the data format of the resampled output data to an output data format.

19. The resampling method of claim 16, further comprising monitoring, by a synchronization detection unit, a data synchronization status and terminating the output of the resampled output data when a synchronization loss is detected.

20. The resampling method of claim 15, further comprising bypassing, by a bypass unit, resampling operations when the I/D value of the control signal is one and transmitting the input data to a data selector.

* * * * *